(12) United States Patent
Sahu et al.

(10) Patent No.: US 11,312,082 B2
(45) Date of Patent: Apr. 26, 2022

(54) HYBRID ADDITIVE MANUFACTURING SYSTEM

(71) Applicant: The Boeing Company, Chicago, IL (US)

(72) Inventors: Megha Sahu, Bangalore (IN); Om Prakash, Bangalore (IN)

(73) Assignee: The Boeing Company, Chicago, IL (US)

( * ) Notice: Subject to any disclaimer, the term of this patent is extended or adjusted under 35 U.S.C. 154(b) by 211 days.

(21) Appl. No.: 16/736,411

(22) Filed: Jan. 7, 2020

(65) Prior Publication Data
US 2021/0206115 A1 Jul. 8, 2021

(51) Int. Cl.
| | | |
|---|---|---|
| *B29C 64/393* | (2017.01) | |
| *B33Y 40/20* | (2020.01) | |
| *B33Y 50/02* | (2015.01) | |
| *C23C 14/54* | (2006.01) | |
| *C23C 14/04* | (2006.01) | |
| *C23C 14/20* | (2006.01) | |
| *C23C 14/34* | (2006.01) | |
| *B33Y 30/00* | (2015.01) | |

(52) U.S. Cl.
CPC ............ *B29C 64/393* (2017.08); *B33Y 30/00* (2014.12); *B33Y 40/20* (2020.01); *B33Y 50/02* (2014.12); *C23C 14/042* (2013.01); *C23C 14/205* (2013.01); *C23C 14/34* (2013.01); *C23C 14/54* (2013.01)

(58) Field of Classification Search
CPC ..... B29C 64/10; B29C 64/118; B29C 64/393; B33Y 30/00; B33Y 40/20; B33Y 50/02
See application file for complete search history.

(56) References Cited

U.S. PATENT DOCUMENTS

| | | | |
|---|---|---|---|
| 6,609,043 B1* | 8/2003 | Zoia ........................ | B22F 10/28 700/119 |
| 9,976,815 B1* | 5/2018 | Roper ....................... | F28D 7/08 |
| 2014/0314964 A1* | 10/2014 | Ackelid .............. | C23C 16/4417 427/496 |
| 2018/0056435 A1* | 3/2018 | Ladani .............. | H01L 23/53276 |
| 2018/0207749 A1* | 7/2018 | Wasynczuk ............ | C25D 15/00 |

OTHER PUBLICATIONS

Huber, Christian, et al.; "3D Printing of Polymer-Bonded Rare-Earth Magnets With a Variable Magnetic Compound Fraction for a Predefined Stray Field", Scientific Reports | 7: 9419 | DOI:10.1038/s41598-017-09864-0; Aug. 25, 2017; Aug. 25, 2017 Available at https://doi.org/10.1038/s41598-017-09864-0.

Meng, F. et al.; "Rapid Assessment of the Ce—Co—Fe—Cu System for Permanent Magnetic Applications"; Recent Developments in the Processing of Magnetic Materials; Apr. 23, 2018 Available at https://www.additivemanufacturing.media/news/-ornl-researchers-demonstrate-3d-printed-magnets-outperform-those-manufactured-traditionally.

"ORNL Researchers Demonstrate 3D-Printed Magnets Outperform Those Manufactured Traditionally"; Additive Manufacutring Media; Dec. 28, 2016 Available at https://doi.org/10.1007/s11837-018-2862-8.

* cited by examiner

*Primary Examiner* — Nahida Sultana
(74) *Attorney, Agent, or Firm* — Felix L. Fischer (57) ABSTRACT

A hybrid additive manufacturing system a build chamber, a polymer additive manufacturing system housed within the build chamber and a physical vapor deposition (PVD) system housed within the build chamber. A controller is configured to issue control signals to the polymer additive manufacturing system and PVD system for layered deposition of polymer and PVD layers in a multilayer part.

21 Claims, 9 Drawing Sheets

HYBRID ADDITIVE MANUFACTURING SYSTEM

BACKGROUND INFORMATION

Field

This disclosure relates generally to the field of additive manufacturing (AM) systems and, more particularly to a hybrid AM system incorporating Fused Deposition Modeling (FDM) and physical vapor deposition (PVD).

Background

Manufacturing of various detailed parts for aircraft and other complex systems is employing three dimensional (3D) additive manufacturing techniques. Additive manufacturing has emerged as crucial manufacturing technology due to its ability to reduce materials wastage, fabricate complex geometries as one part with various materials without requirements for assembly, and provide a replacement for molding technologies. Additive manufacturing is also a useful technique for making quick prototypes and to support evaluation of various concepts during early design and planning stages. Existing processes used for additive manufacturing include laminated engineering net shaping (LENS), electron beam melting (EBM), fused deposition modeling (FDM), stereolithography, polyjet, selective laser sintering (SLS), and laminated object manufacturing (LOM). Current additive manufacturing processes deal with a single material although integration of multiple materials belonging to the same class has also been demonstrated.

SUMMARY

Exemplary implementations of a hybrid additive manufacturing system having a build chamber, a polymer additive manufacturing system housed within the build chamber and a physical vapor deposition (PVD) system housed within the build chamber. A controller is configured to issue control signals to the polymer additive manufacturing system and PVD system for layered deposition of polymer and PVD layers in a multilayer part.

The exemplary implementations provide a method for hybrid additive manufacturing wherein a part geometry is obtained including layer definitions from a Computer Aided Design (CAD) database. A build geometry is determined with information on multi-material locations and slicing for layer printing. Build instructions are issued for positioning of a fused deposition modeling (FDM) system. The FDM printing head is scanned for polymer layer deposition with issuing of control signals to a gantry and a print head. A control signal is then issued to a sputter coating head to introduce a metallic layer.

BRIEF DESCRIPTION OF THE DRAWINGS

The features, functions, and advantages that have been discussed can be achieved independently in various implementations or may be combined in yet other implementations further details of which can be seen with reference to the following description and drawings.

DETAILED DESCRIPTION

The implementations described herein provide for fabrication of polymer parts with spatially varied functional properties using fused deposition modeling (FDM) as an example of a polymer additive manufacturing system. Physical vapor deposition (PVD) of functional materials over selected polymer layers deposited by an FDM system is accomplished by employing a sputter coating head. The functional materials impart desired spatially varied functional properties to the manufactured part such as electrical conductivity, thermal conductivity, dielectric barrier, wear resistance and magnetic properties. Example implementations disclosed use at least one sputter coating head located proximate at the top of a build chamber. The sputter coating head provides for interchangeable target materials (ceramic, metal or polymer). Employing conductive metals in the target material allows for example electromagnetic shielding functionality in the final part. Magnetic material layers deposited in desired regions can help with absorption of the external lines of force of a magnetic field and hence provide protection from interference. Additionally, piezoelectric, magnetic or thermal and electrically conductive properties may be imparted to polymer parts. Wear resistant coatings may be deposited on polymer parts while internal lubricity can be incorporated within part with use of PVD materials such WS2 and MoS2.

Figure 1A:
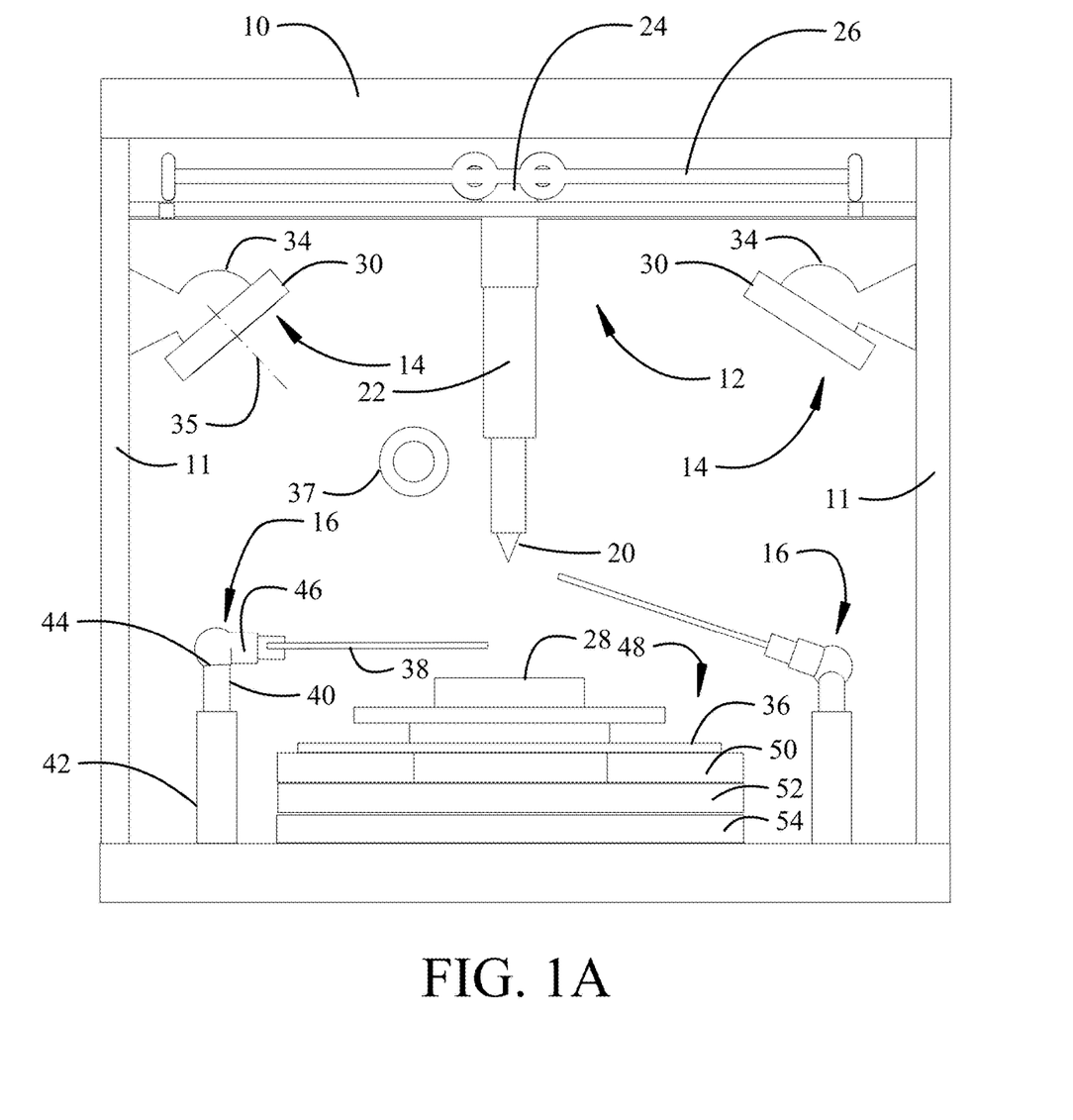
FIG. 1A is a front view of an example implementation with the front wall removed.
Figure 1B:
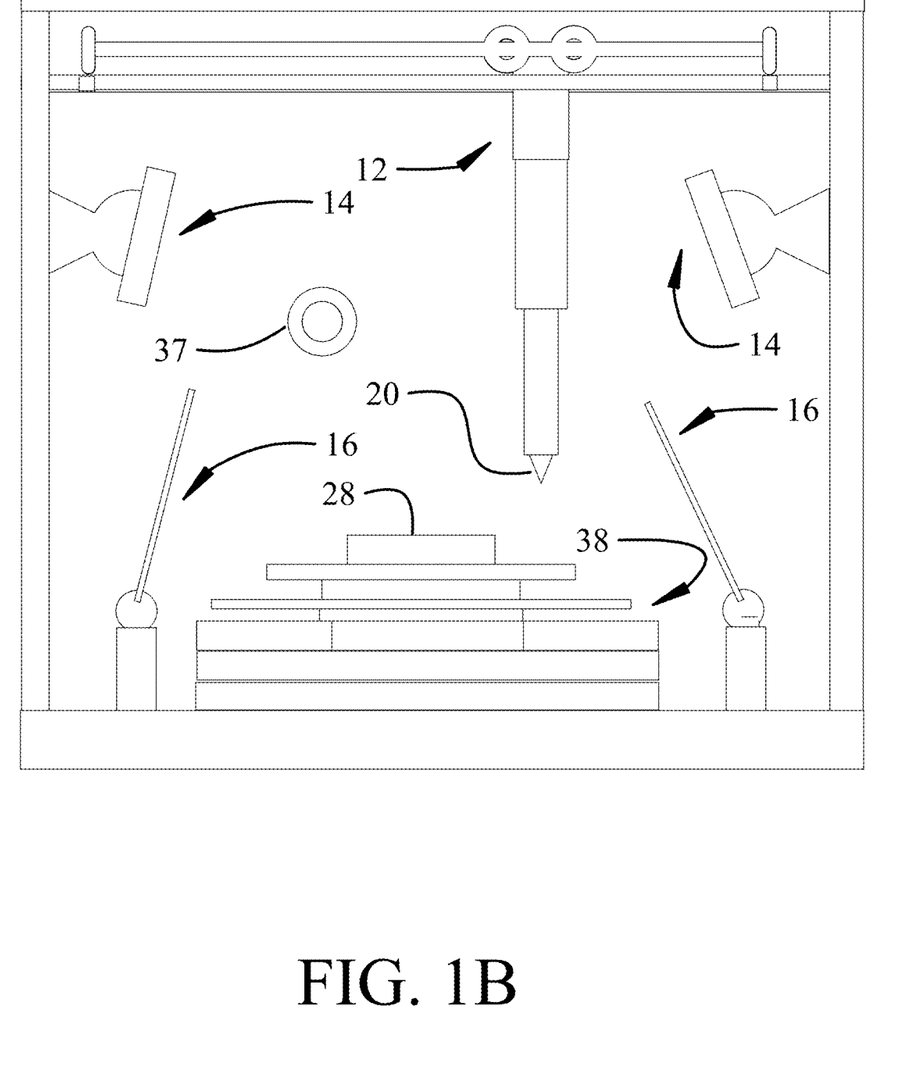
FIG. 1B is a front view of the example implementation with the rigid masks withdrawn by the mask placement assembly.
Figure 2:
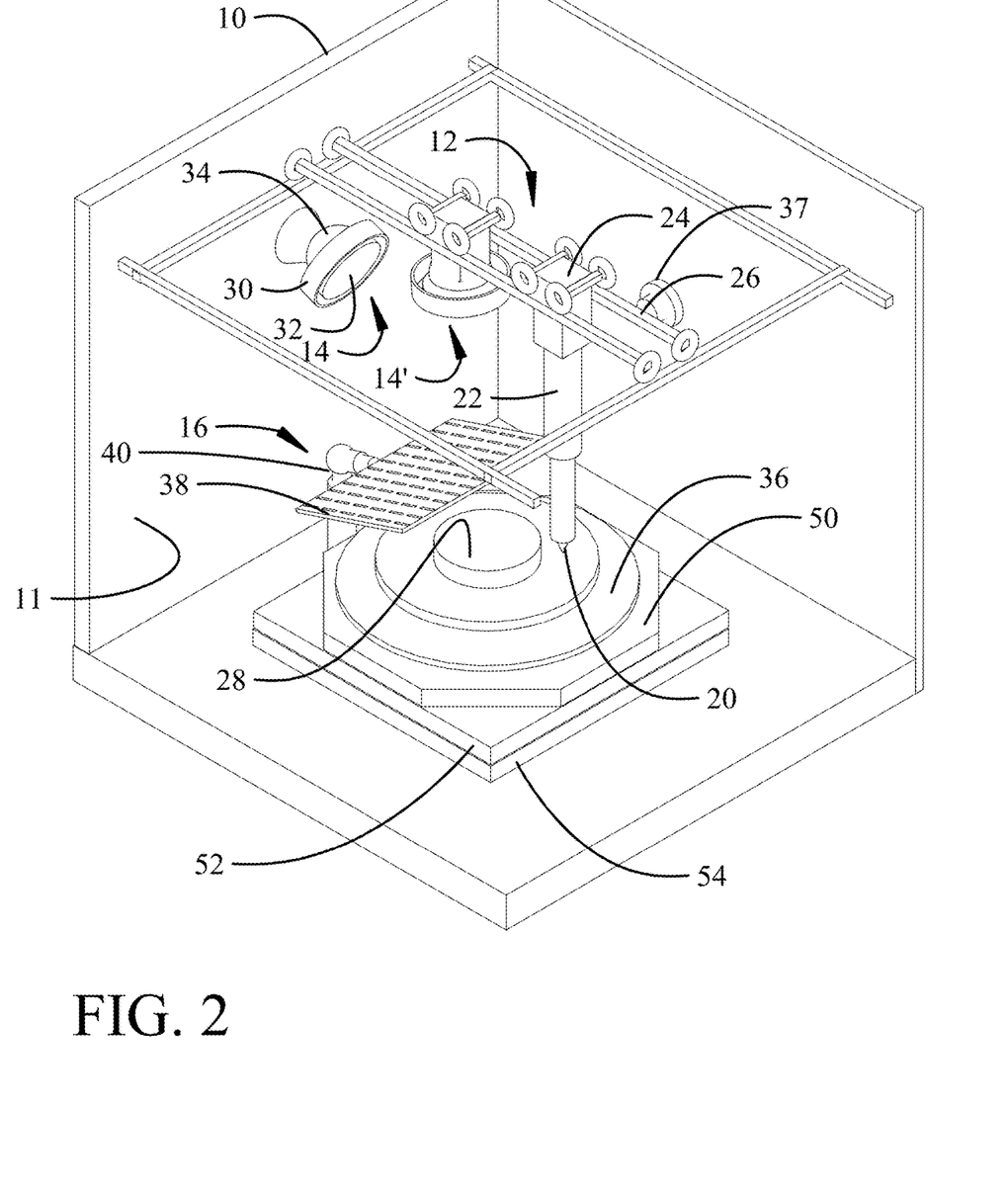
FIG. 2 is a pictorial view of the implementation of FIG. 1 with the top and right side walls removed and the right PVD assembly and right mask assembly removed for clarity.

Referring to the drawings, FIGS. 1A, 1B and 2 show an example implementation of the build chamber 10 with an FDM system 12 and PVD system 13 including at least one sputter coating head 14 and masking systems 16. The build chamber 10 includes control elements for pressure/vacuum, typically vacuum pump through appropriate tubing, valves, controls interfaced with a computerized controller, sealing gaskets in main chamber enclosure, provision for safety considerations, selection of materials and components so as to avoid any contamination by oils, greases or other contaminants as known in the art, and atmospheric composition including introduction and control of inert gases such as argon or nitrogen.

The example FDM system 12 shown in the drawings includes a deposition or printing head 20 mounted on a telescopic arm 22 which extends from a mobile cart 24 mounted on a two axis gantry 26. Three-axis control for positioning of the printing head 20 allows deposition of polymer material layers on a multilayer part 28. For the example in the drawings, the mobile cart and gantry are electromechanical systems with wheel or chain driven actuation by electric motors. In alternative implementations hydraulic linear actuation systems may be employed. In other alternative implementations the gantry and cart may be replaced by a 3-axis articulated positioning system carrying in the FDM printing head 20.

The PVD system 13 for the example implementation includes sputter coating heads 14 within the chamber 10 which incorporate a magnetic deflection assembly 30 and a sputtering target 32 mounted to a gimbal 34 for angular adjustment. In the implementation as shown in the drawings, the sputter coating head is attached to walls 11 of the build chamber 10 or the two axis gantry 26. An automated exchange/replacement of the sputtering target 32 is employed in selected implementations for modifying the PVD layer functionality for differing layers. Rotation of +/−45° from a nominal axis 35 is employed in the example implementation to direct the sputtered metallic atoms to the multilayer part 28 during PVD. The gimbal 34 employs electromechanical actuation for one or two rotational axes. The multilayer part 28 is supported on a grounded baseplate 36. While two sputter coating heads mounted to opposing walls are shown in the example implementation of FIG. 1, a single head or multiple heads may be employed in alternative implementations. In other alternative implementations, a sputter coating head 14' is mounted to a cart 24' on the gantry 26, as seen in FIG. 2, for X-Y positioning in addition to angular adjustment. In certain implementations, an additional electromagnet 37 is positioned on a wall 11 of the chamber to change alignment of magnetic particles with respect to sputter coater axis. The magnetic particles may be aligned radially or axially with respect to the sputter coater axis To accommodate patterning of the sputter coating on the multilayer part 28, masking systems 16 are positioned to shadow mask the multilayer part with respect to the sputter coating heads 14. The masking systems 16 employ a rigid mask 38 supported by a mask placement assembly 40. The exemplary mask placement assembly 40 includes a telescoping pedestal 42, an articulating joint 44 and a telescoping arm 46 on which the rigid mask 38 is mounted to extend, withdraw and position the rigid mask relative to the multilayer part 28 and the sputter coating head 14 for desired metallic layer deposition. The rigid mask will typically be oriented horizontally during PVD deposition. The articulating joint 44 provides one or two rotation axes for angular positioning of the rigid mask 38. For the example implementation, the articulating joint 44, telescoping pedestal 42 and telescoping arm 46 employ electromechanical actuation. In alternative implementations, hydraulic actuation may be employed.

For FDM processing, the rigid masks 38 are withdrawn by the mask placement assembly 40 to allow access to the multilayer part 28 by the printing head 20 as shown in FIG. 1B.

A positioning system 48 supports the multilayer part 28 and provides a rotation stage 50, an X-positioning stage 52 and a Y-positioning stage 54. The positioning system 48 is employed in conjunction with the mobile cart 24 and 2-axis gantry 26 of the FDM system for relative positioning of the multilayer part with respect to the printing head 20 and for positioning of the multilayer part with respect to the sputter coating heads 14 and masking systems 16. In alternative implementations, the positioning system 48 replaces or is replaced by the 2-axis gantry 26 and mobile cart 24. Similarly, in alternative implementations, the masking system 16 is supported by a positioning system for motion relative to the multilayer part 28, which is rigidly mounted.

Figure 3:
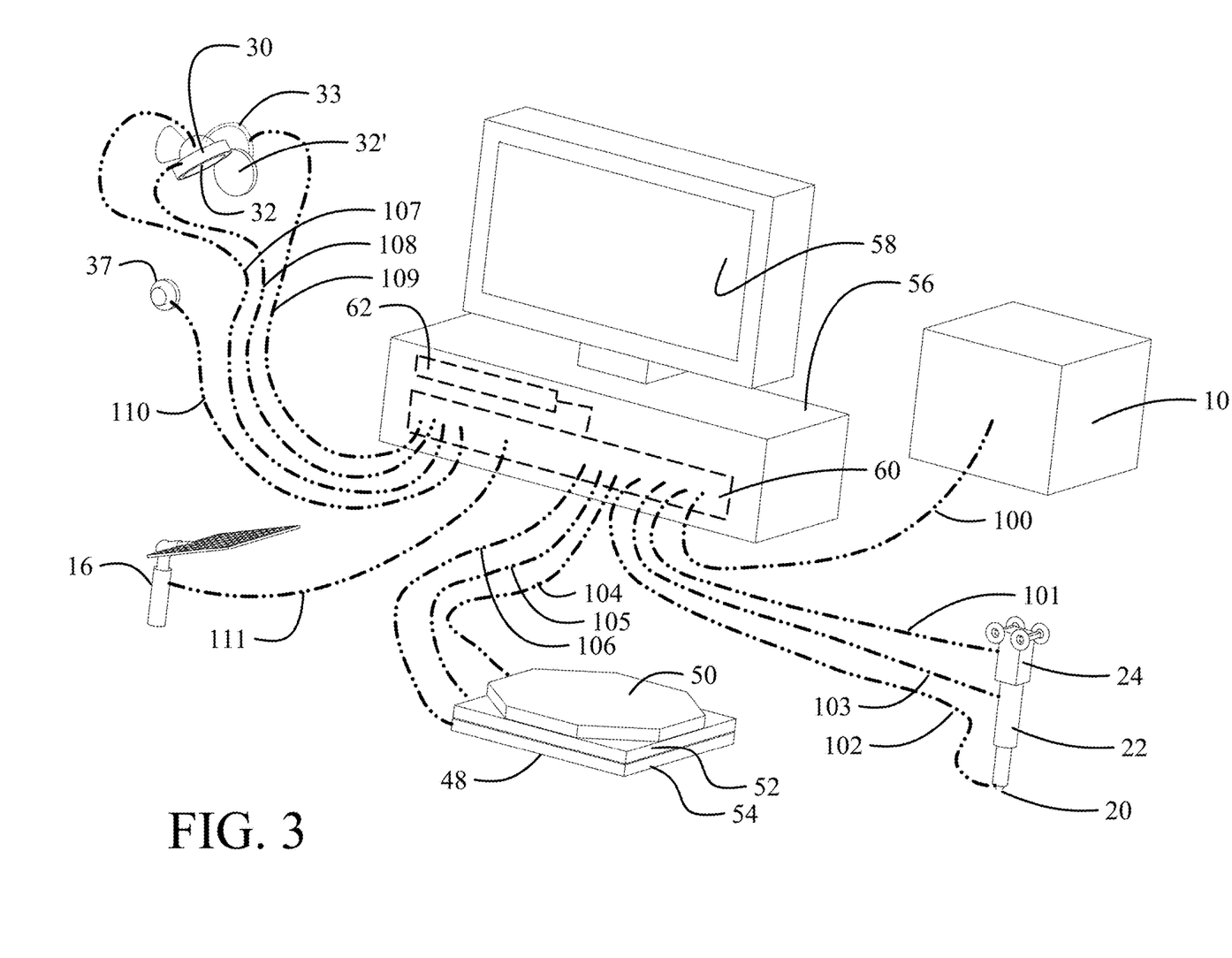
FIG. 3 is a block diagram of the FDM system and PVD system and control system.

Control of the FDM system 12, sputtering heads 14 and masking systems 16 is accomplished with a controller 56 as shown in FIG. 3. The controller 56 is implemented in various examples as a microprocessor implemented computer system having software and hardware control modules 60, to be described in greater detail subsequently. In alternative implementations the controller may employ ASIC controls. Controller 56 incorporates a display 58 for process monitoring by operators. The controller 56 employs a Computer Aided Design (CAD) database 62 with details of the design of the multilayer part 28 allowing sequential build up using PVD and FDM processes with layer geometry and processing parameters related to sequential deposition using FDM and PVD defined in the database.

The control modules 60 provide functional control signals to the FDM system, PVD system and other components as shown in FIG. 3. While representative of the control signals provided, additional or multiple signals may be required for actual implementations. The chamber 10 receives control signal 100 for vacuum/pressure and gas composition control. The FDM system receives control signal 101 for movement and positioning of the gantry 26 and cart 24 during polymer layer deposition. Similar positioning may be accomplished for a gantry mounted sputter coating head 14' as previously discussed. A control signal 102 is provided to the printing head 20 for deposition of the polymer layers with control signal 103 provided to the telescopic arm 22 for profile positioning of the printing head. Positioning system 48 receives control signal 104 for rotational positioning of the multilayer part by rotation stage 50, control signal 105 for X-axis translation of the multilayer part with X-positioning stage 52 and control signal 106 for Y-axis translation of the multilayer part by Y-positioning stage 54. The sputter coating head 14 receives control signal 107 for angular positioning of the gimbal and control signal 108 for activation of magnetic deflection assembly 30 for initiation and control of sputtering from the target 32. A control signal 109 is provided to a manipulator 33 for automated exchange of the sputtering target 32 with an alternate target 32'. Electromagnet 37 receives a control signal 110 for magnetic particle alignment during sputtering. Masking system 16 receives a control signal 111 for positioning of the rigid mask, as required, during PVD operation.

Figure 4:
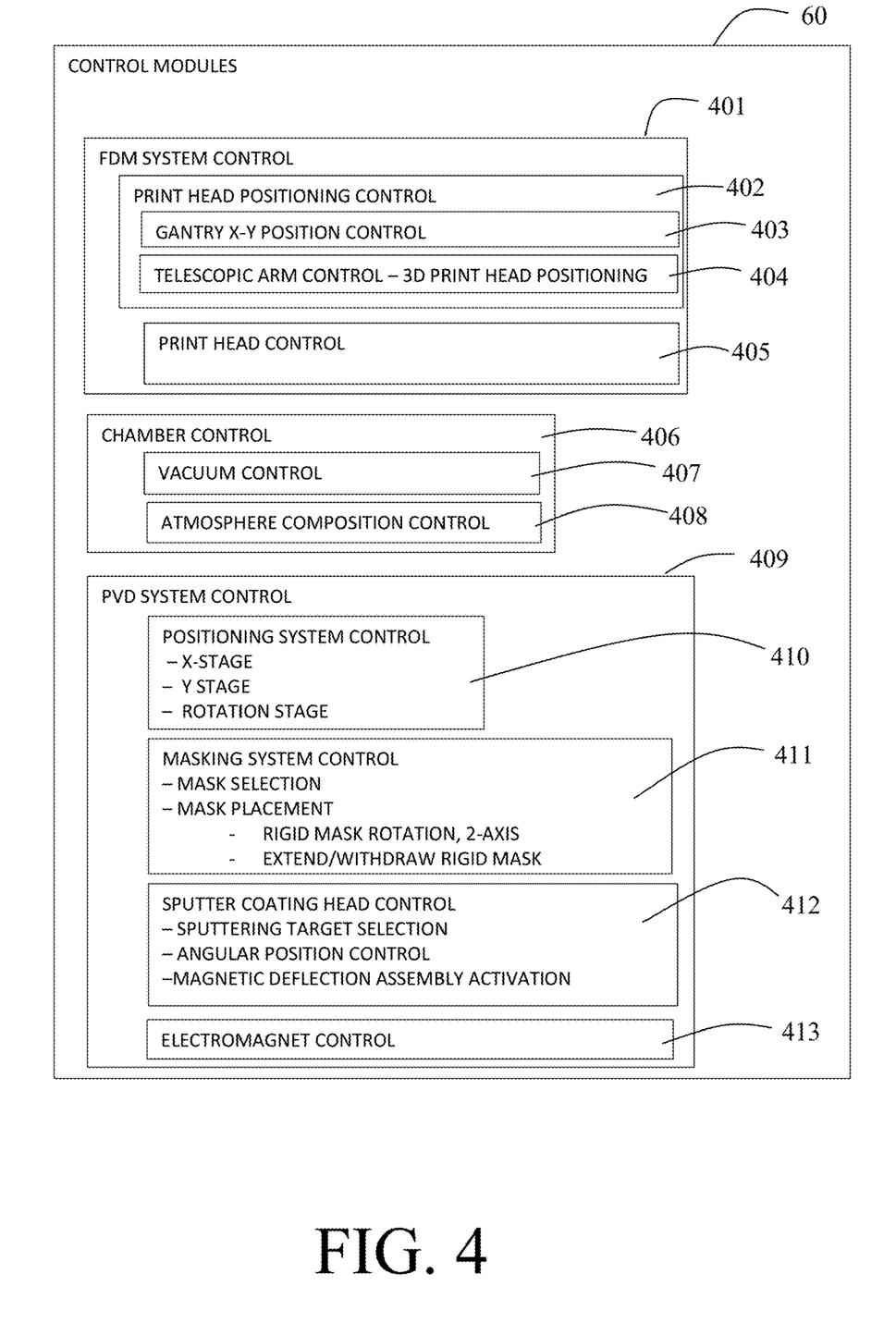
FIG. 4 is a block diagram of the control system modules for operation of the FDM system and PVD system.

Exemplary control modules 60 to be employed in the controller 56 in the implementation described are shown in FIG. 4. An FDM system control module 401 provides overall control of the FDM system 12 for printing of polymeric layers. A print head positioning control module 402 includes submodules for gantry X-Y position control 403 and telescopic arm control 404 to allow translation of the printing head 20 while a print head control module 405 activates the printing head for depositing polymeric layers in the multilayer part 28. A chamber control module 406 includes submodules for vacuum control 407 and atmosphere composition control 408 to provide the appropriate conditions in the chamber 10 for FDM polymer deposition or PVD metallic layer deposition. A PVD system control module 409 incorporates submodules for positioning system control 410, masking system control 411, sputter coating head control 412, and electromagnet control 413. The positioning system control module 410 provides X-stage, Y-stage and rotation stage operation to position the multilayer part 28 with respect to the sputter coating head 14 and the masking system 16 to obtain the desired metallic layer deposition on the multilayer part. The masking system control module 411 provides mask selection for various patterns and mask placement including rigid mask rotation and extension or withdrawal of the mask for FDM operations.

Figure 5A:
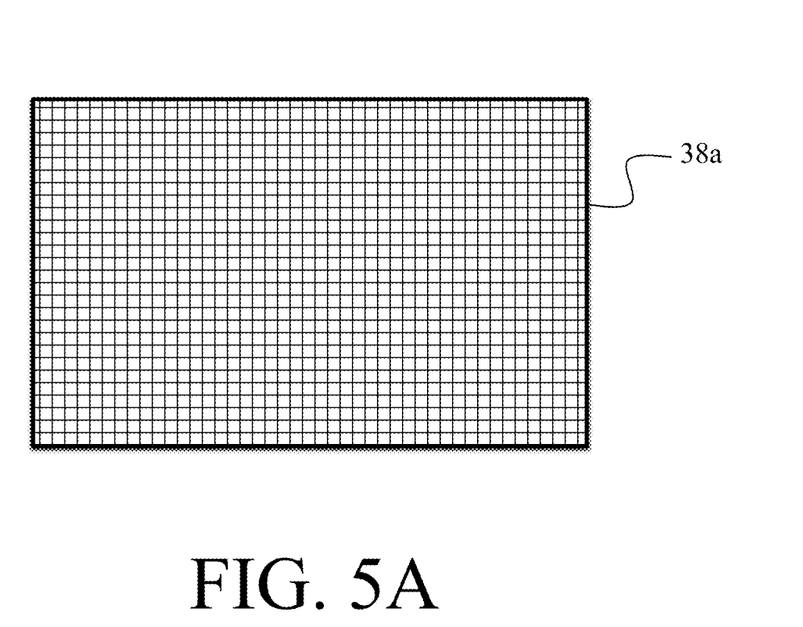
FIGS. 5A-5E are representative views of example masking patterns for use in the example implementation; and, FIG. 6 is a flow chart of a method for hybrid additive manufacturing using the exemplary implementations.
Figure 5B:
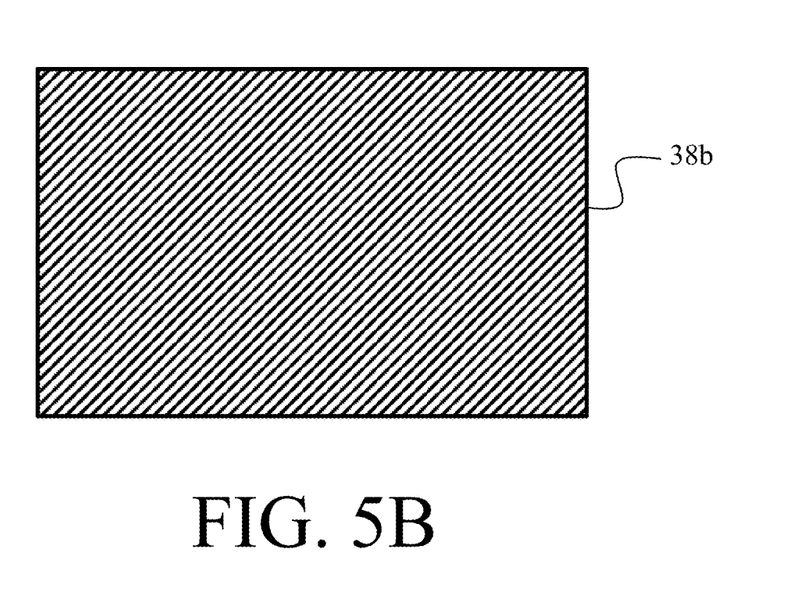
Figure 5C:
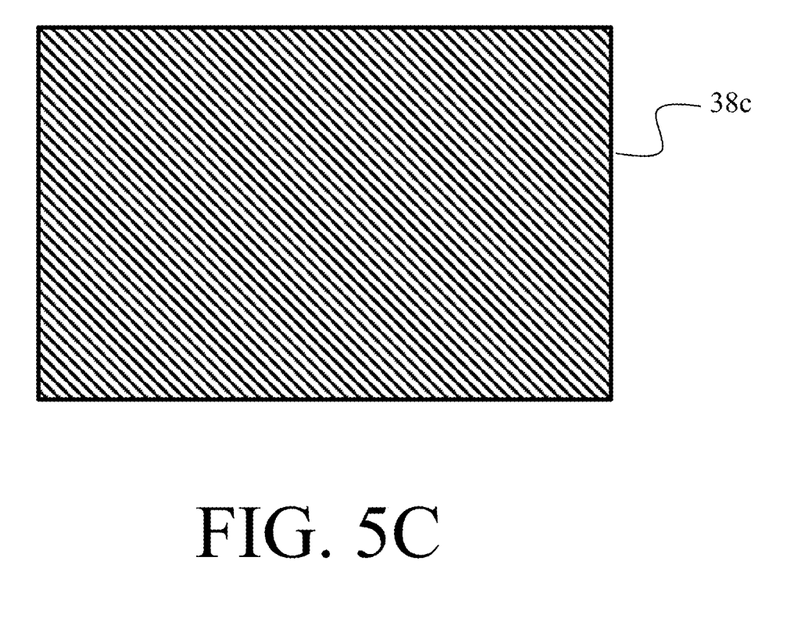
Figure 5D:
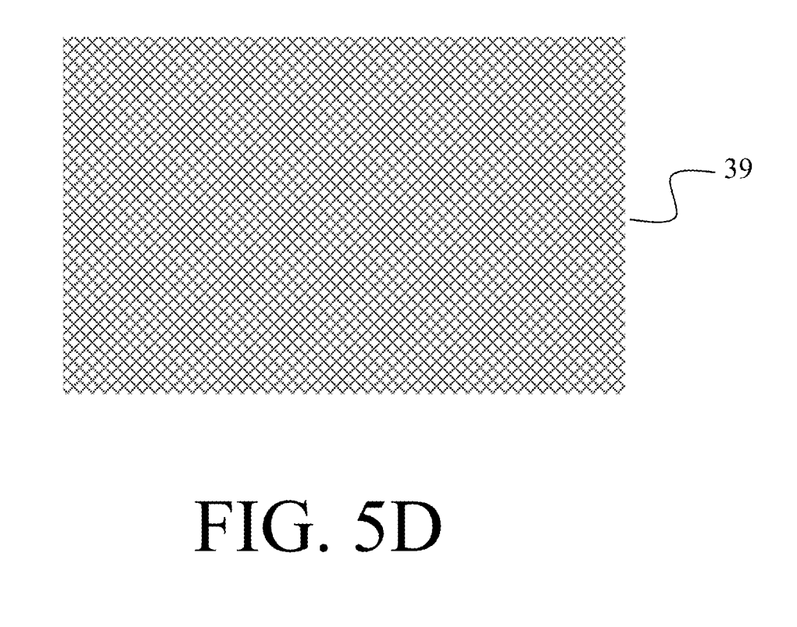
Figure 5E:
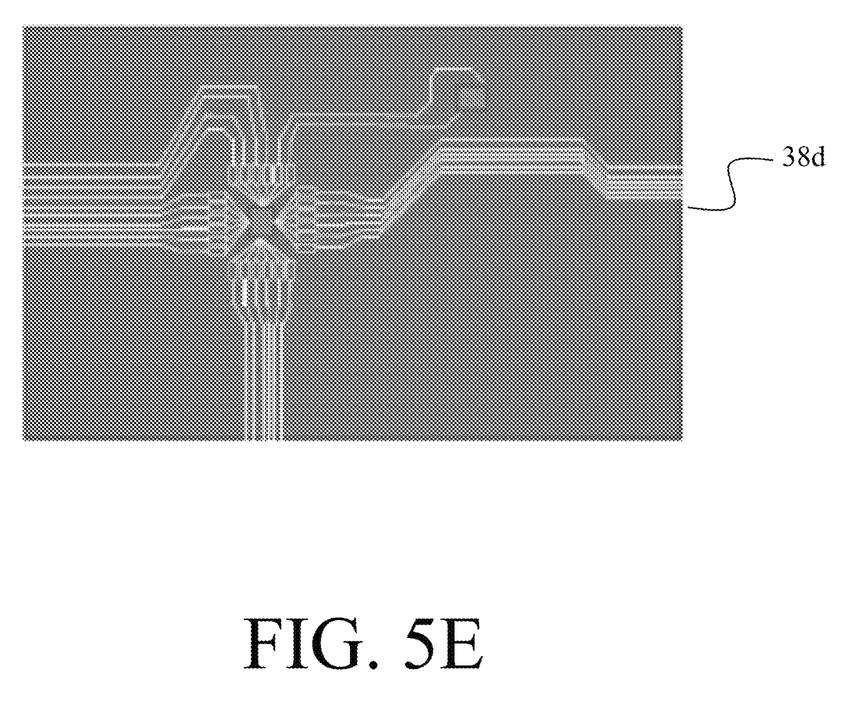

As seen in FIGS. 5A-5E, various rigid masks are employed for varying effects in the PVD layers. FIG. 5A shows a masking pattern 38a which is employed to create an array of metallic dots. While this array does not provide in-plane conductivity, increased local stiffness or electromagnetic shielding may be obtained. FIGS. 5B and 5C show masking patterns 38b and 38c for deposition of conducting metallic material in a directional manner to impart anisotropic electrical or thermal conductivity in the resulting structure of a deposited layer. For applications requiring more isotropic electrical or thermal conductivity, an interconnected metallic network can be obtained by sequential deposition of two layers of pattern employing masking pattern 38b or 38c (FIG. 5B or 5C), resulting in a deposition pattern 39 shown in FIG. 5D. FIG. 5E shows a masking pattern 38d for deposition of electrical traces utilized for applications such as embedded sensors or wearable electronics when such deposition is used on flat fabric layers to connect to other embedded functionalities.

Figure 6:
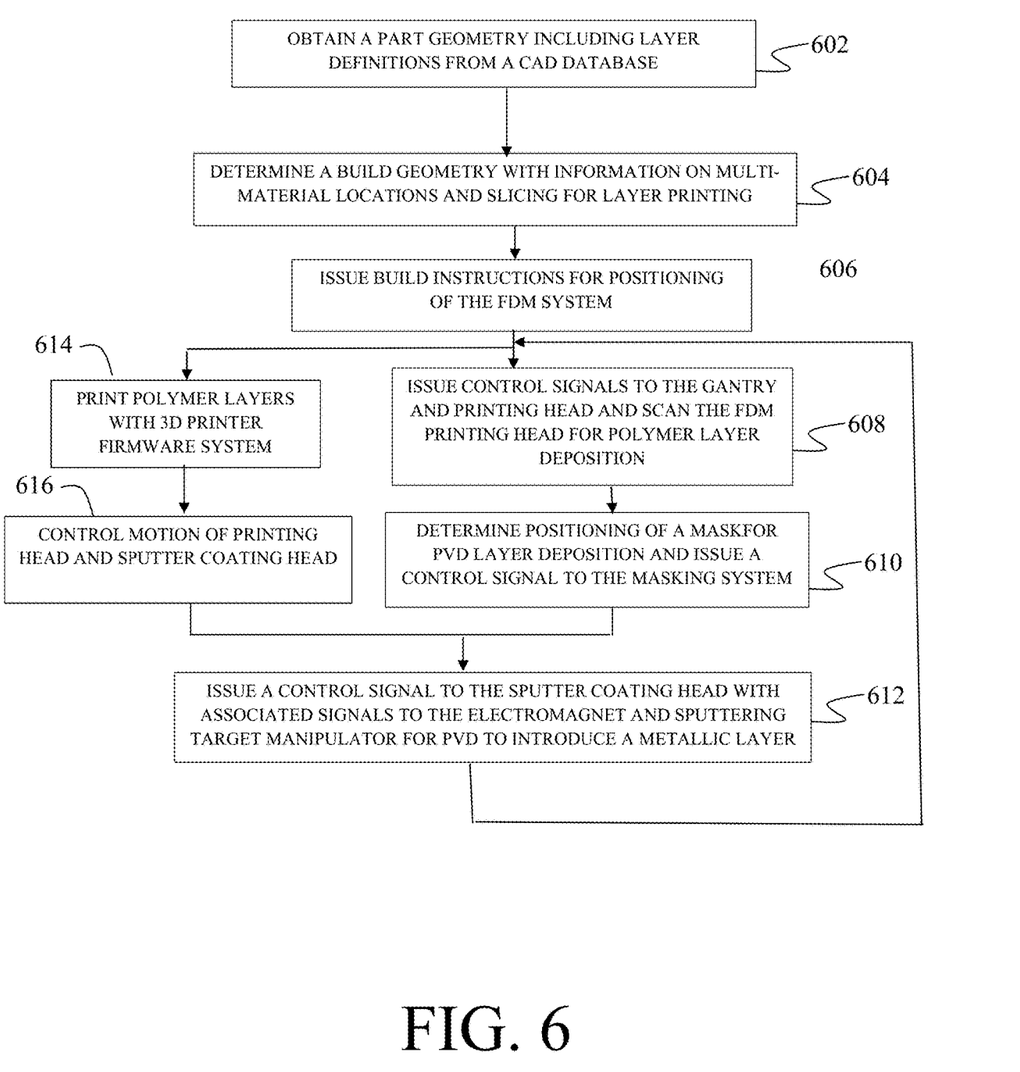

The implementation disclosed provides a method 600 for hybrid additive manufacturing as shown in FIG. 6 wherein a part geometry including layer definitions is obtained from a CAD database, step 602. A build geometry with information on multi-material locations and slicing for layer printing is determined, step 604. Build instructions are issued for positioning of the FDM system, step 606, and scanning of the FDM printing head for polymer layer deposition is accomplished with issuing of control signals to the gantry and printing head, step 608. Positioning of a mask, if required, for PVD layer deposition is determined and a control signal to the masking system is issued, step 610. PVD is accomplished by issuing a control signal to the sputter coating head 14 with associated signals to the electromagnet and sputtering target manipulator to introduce a metallic layer, step 612. Selected material properties in the sputtering target material and masking design provides for creation of thermal or electrical conducing layers intermediate polymer layers in the multilayer part 28. PVD layers in selected implementations provide designed magnetic properties or electromagnetic shielding. Selection of metallic or ceramic target materials allows creation of designed barrier properties within the multilayer part 28. Alignment of sputtered magnetic material layers is accomplished with the electromagnet for radial or axial alignment within the multilayer part 28 and a pre-designed magnetic field may be generated within the part. Selected masking design is also employed to deposit hidden magnetic sample tags between polymer layers in the multilayer part 28. Printing of polymer layers is alternatively controlled by 3D printer firmware, step 614, with associated motion of the print head and sputter coating head, step 616. Steps 608-616 are repeated for multiple polymer and PVD metallic layers to create a final geometry of the fabricated multilayer part. During various stages of the FDM polymer deposition and PCD layer deposition, it is also required that appropriate process conditions relative to temperature, vacuum and atmosphere composition be maintained by control of the chamber 10, as previously described.

The implementations and method as described herein allow fabrication of a complete multilayer part with both polymer layers and interspersed PVD layers in a single manufacturing operation. The integral PVD operation allows a material to be deposited between polymer layers to fabricate in-situ composite parts.

Having now described various implementations in detail as required by the patent statutes, those skilled in the art will recognize modifications and substitutions to the specific implementations disclosed herein. Such modifications are within the scope and intent of the following claims. Within the specification and the claims, the terms "comprising", "incorporate", "incorporates" or "incorporating", "include", "includes" or "including", "has", "have" or "having", and "contain", "contains" or "containing" are intended to be open recitations and additional or equivalent elements may be present. As used herein the terms "upper" and "lower" are employed to describe relative positioning and other than for the specific implementations disclosed may be substituted with appropriate descriptors such as "first" and "second", "top" and "bottom" or "right" and "left" depending on orientation of actual implementation.

What is claimed is:

1. A hybrid additive manufacturing system comprising:
   a build chamber;
   a polymer additive manufacturing system housed within the build chamber;
   a physical vapor deposition (PVD) system housed within the build chamber; and
   a controller configured to issue control signals to the polymer additive manufacturing system and PVD system for layered deposition of polymer and selected intermediate PVD layers in a multilayer part.

2. A hybrid additive manufacturing system comprising:
   a build chamber;
   a polymer additive manufacturing system housed within the build chamber wherein the polymer additive manufacturing system is a fused deposition modeling (FDM) system;
   a physical vapor deposition (PVD) system housed within the build chamber; and
   a controller configured to issue control signals to the polymer additive manufacturing system and PVD system for layered deposition of polymer and PVD layers in a multilayer part.

3. The hybrid additive manufacturing system as defined in claim 2 wherein the FDM system comprises:
   a deposition or printing head mounted on a telescopic arm extending from a mobile cart mounted on a two axis gantry, said telescopic arm and a two-axis gantry providing three axis control of for positioning of the printing head.

4. The hybrid additive manufacturing system as defined in claim 3 wherein the PVD system comprises:
   at least one sputter coating head within the build chamber, the sputter coating head incorporating a magnetic deflection assembly and a sputtering target mounted to a gimbal for angular adjustment.

5. The hybrid additive manufacturing system as defined in claim 4 wherein the at least one sputter coating head is mounted to a wall of the build chamber.

6. The hybrid additive manufacturing system as defined in claim 4 wherein the at least one sputter coating head is mounted to the two axis gantry.

7. The hybrid additive manufacturing system as defined in claim 4 further comprising an electromagnet mounted in the build chamber.

8. The hybrid additive manufacturing system as defined in claim 4 further comprising:
   at least one masking system positioned to shadow mask the multilayer part with respect to the at least one sputter coating head, said at least one masking system employing a rigid mask supported by a mask placement assembly.

9. The hybrid additive manufacturing system as defined in claim 8 wherein the mask placement assembly comprises:
   a telescoping pedestal;
   an articulating joint mounted on the telescoping pedestal; and
   a telescoping arm, extending from the articulating joint, wherein the rigid mask is mounted to the telescoping arm to extend, withdraw and position the rigid mask relative to the multilayer part and the sputter coating head for desired metallic layer deposition.

10. The hybrid additive manufacturing system as defined in claim 9 wherein the controller comprises control modules including
an FDM system control module providing control of the FDM system for printing of polymeric layers;
a print head positioning control module providing gantry X-Y position control and telescopic arm control to allow translation of the printing head;
a print head control module configured to activate the printing head for depositing polymeric layers in the multilayer part;
a chamber control module providing vacuum control and atmosphere composition control for appropriate conditions in the build chamber for FDM polymer deposition or PVD metallic layer deposition;
a PVD system control module providing positioning system control, masking system control, sputter coating head control, and electromagnet control; and
a masking system control module providing mask selection and positioning for various patterns.

11. The hybrid additive manufacturing system as defined in claim 10 further comprising:
a positioning system supporting the multilayer part, having
a rotation stage;
an X-positioning stage; and
a Y-positioning stage;
and wherein control modules further include a positioning system control module providing X-stage, Y-stage and rotation stage operation to position the multilayer part with respect to the sputter coating head and the masking system for deposition of a metallic layer on the multilayer part.

12. The hybrid additive manufacturing system as defined in claim 10 wherein the rigid mask is selected from one of a masking pattern for bridging of adjacent polymer layers through an array of holes in the metallic layer, a masking pattern for deposition of conducting metallic material in a directional manner to impart anisotropic electrical or thermal conductivity in a deposited layer, and, a masking pattern for deposition of electrical traces.

13. The hybrid additive manufacturing system as defined in claim 11 wherein the controller issues control signals for one or more of the following
a control signal for vacuum/pressure and gas composition control in the build chamber;
a control signal for movement and positioning of the gantry and cart during polymer layer deposition;
a control signal to the printing head for deposition of the polymer layers;
a control signal to the telescopic arm for profile positioning of the printing head;
a control signal for rotational positioning of the multilayer part by the rotation stage;
a control signal for X-axis translation of the multilayer part with X-positioning stage;
a control signal for Y-axis translation of the multilayer part by Y-positioning stage;
a control signal for angular positioning of the gimbal of the sputter coating head;
a control signal for activation of the magnetic deflection assembly for initiation and control of sputtering from the sputtering target;
a control signal to a manipulator for automated exchange of the sputtering target;
a control signal to an electromagnet for magnetic particle alignment during sputtering; and,
a control signal for positioning of the rigid mask during PVD operation.

14. The hybrid additive manufacturing system as defined in claim 13 wherein the controller further comprises a CAD database for the multilayer part.

15. A method for hybrid additive manufacturing comprising:
obtaining a part geometry including layer definitions from a CAD database;
determining a build geometry with information on multi-material locations and slicing for layer printing;
issuing build instructions for positioning of a fused deposition modeling (FDM) system;
scanning a FDM printing head for polymer layer deposition with issuing of control signals to a gantry and a print head; and
issuing a control signal to a sputter coating head to introduce a metallic layer.

16. The method as defined in claim 15 further comprising repeating the scanning of the FDM printing head and issuing a control signal to the sputter coating head to produce a multilayer part.

17. The method as defined in claim 16 further comprising positioning a mask for PVD layer deposition.

18. The method as defined in claim 16 further comprising issuing a control signal to an electromagnet; and
issuing a control signal to a sputtering target manipulator.

19. The method as defined in claim 18 wherein the issuing of the control signal to the electromagnet provides alignment of sputtered magnetic material layers with radial or axial alignment within the multilayer part to generate a pre-designed magnetic field within the multilayer part.

20. The method as defined in claim 19 wherein the step of issuing a control signal to the sputtering target manipulator further comprises selecting material properties in a sputtering target material and the step of positioning a mask further comprises selecting a mask design, thereby creating thermal or electrical conducing layers intermediate polymer layers in the multilayer part for magnetic properties or electromagnetic shielding, or for barrier properties within the multilayer part.

21. The method as defined in claim 20 wherein the step of selecting a masking design comprises selecting a design to deposit hidden magnetic sample tags between polymer layers in the multilayer part.

* * * * *